United States Patent [19]
Wu et al.

[11] Patent Number: 5,066,992
[45] Date of Patent: Nov. 19, 1991

[54] PROGRAMMABLE AND ERASABLE MOS MEMORY DEVICE

[75] Inventors: Tsung-Ching Wu, San Jose; Geeng-Chuan Chern, Cupertino, both of Calif.

[73] Assignee: Atmel Corporation, San Jose, Calif.

[21] Appl. No.: 609,017

[22] Filed: Oct. 29, 1990

Related U.S. Application Data

[60] Continuation of Ser. No. 370,731, Jun. 23, 1989, abandoned, which is a division of Ser. No. 332,879, Apr. 3, 1989, abandoned.

[51] Int. Cl.$^5$ .............................................. H01L 29/78
[52] U.S. Cl. ..................................... 357/23.5; 365/185
[58] Field of Search ........................ 357/23.5; 365/185

[56] References Cited

U.S. PATENT DOCUMENTS

| | | | |
|---|---|---|---|
| 4,282,540 | 8/1981 | Ning et al. | 357/23.5 |
| 4,608,585 | 8/1986 | Keshtbod | 357/23.5 |
| 4,794,333 | 12/1988 | Kamiya et al. | 357/23.5 |
| 4,794,562 | 12/1988 | Kato et al. | 357/23.5 |
| 4,962,481 | 10/1990 | Choi et al. | 357/23.5 |

FOREIGN PATENT DOCUMENTS

| | | | |
|---|---|---|---|
| 55-55571 | 4/1980 | Japan | 357/23.5 |
| 55-153375 | 11/1980 | Japan | 357/23.5 |
| 59-178774 | 10/1984 | Japan | 357/23.5 |
| 59-205763 | 11/1984 | Japan | 357/23.5 |
| 60-246677 | 12/1985 | Japan | 357/23.5 |
| 61-187276 | 8/1986 | Japan | 357/23.5 |
| 61-208865 | 9/1986 | Japan | 357/23.5 |
| 61-228672 | 10/1986 | Japan | 357/23.5 |
| 62-52971 | 3/1987 | Japan | 357/23.5 |
| 62-54472 | 3/1987 | Japan | 357/23.5 |
| 62-95875 | 5/1987 | Japan | 357/23.5 |
| 63-43377 | 2/1988 | Japan | 357/23.5 |
| 63-67783 | 3/1988 | Japan | 357/23.5 |

Primary Examiner—Rolf Hille
Assistant Examiner—Steven Loke
Attorney, Agent, or Firm—Schneck & McHugh

[57] ABSTRACT

An electrically programmable and electrically erasable MOS memory device having a floating gate which is separated from the semiconductor substrate by a thin oxide layer, the memory device also having an impurity implant in the substrate which extends under an edge of the floating gate beneath the thin oxide layer. In one embodiment the thin oxide layer underlies the entire floating gate while in another embodiment only a portion of a small thin side window extends under the floating gate's edge. Also disclosed is a fabrication process in which the one embodiment is formed by first forming the floating gate over the thin oxide layer and then implanting the impurity near an edge of the floating gate. Later steps with heating cause the implanted impurity to diffuse under the floating gate edge. An alternative process first forms a window in the gate oxide layer and implants the impurity through the window. The window is filled with a thin oxide layer and the floating gate is formed so that its edge lies over a portion of the window. Control gates, sources and drains are formed last.

4 Claims, 4 Drawing Sheets

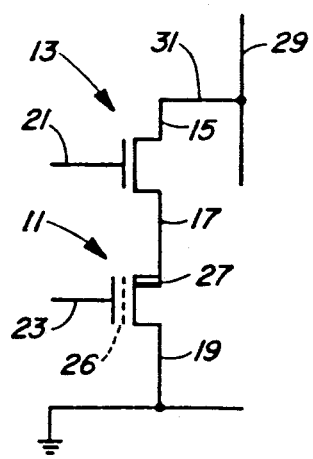
FIG._1
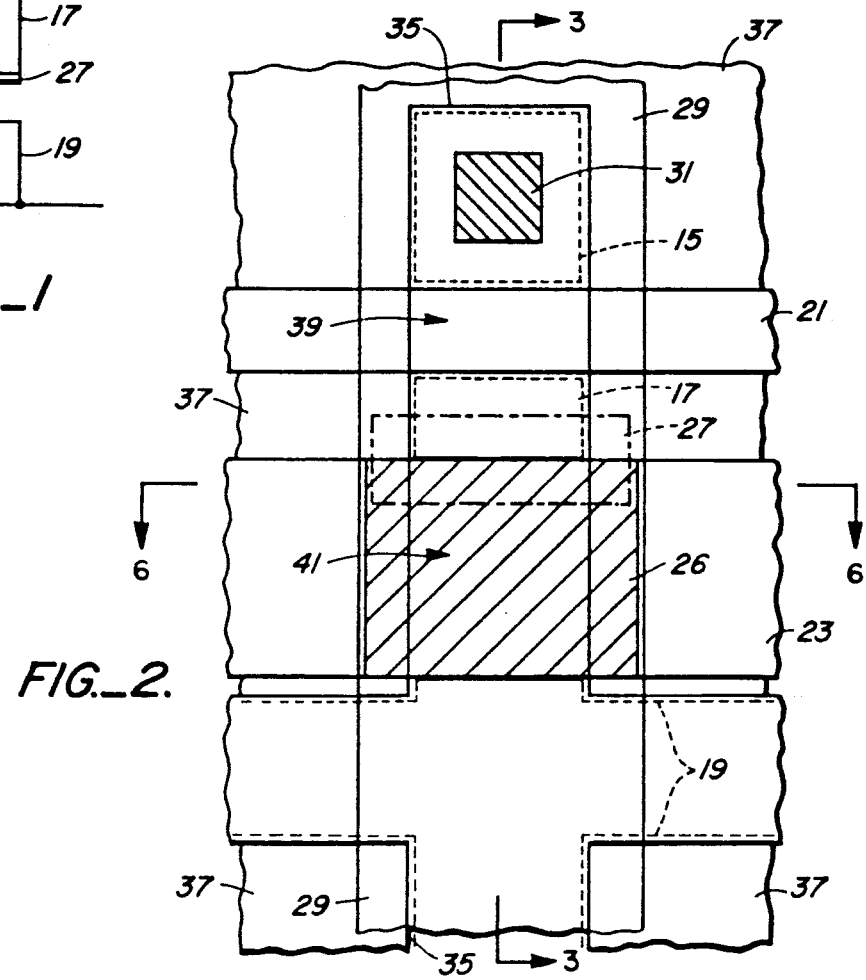
FIG._2.
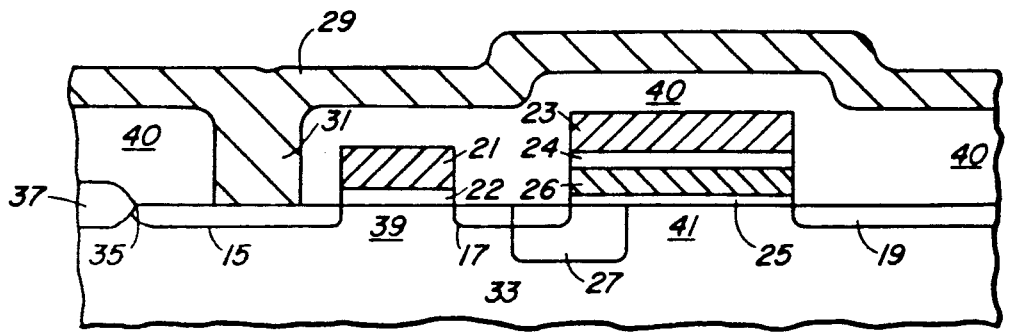
FIG._3.

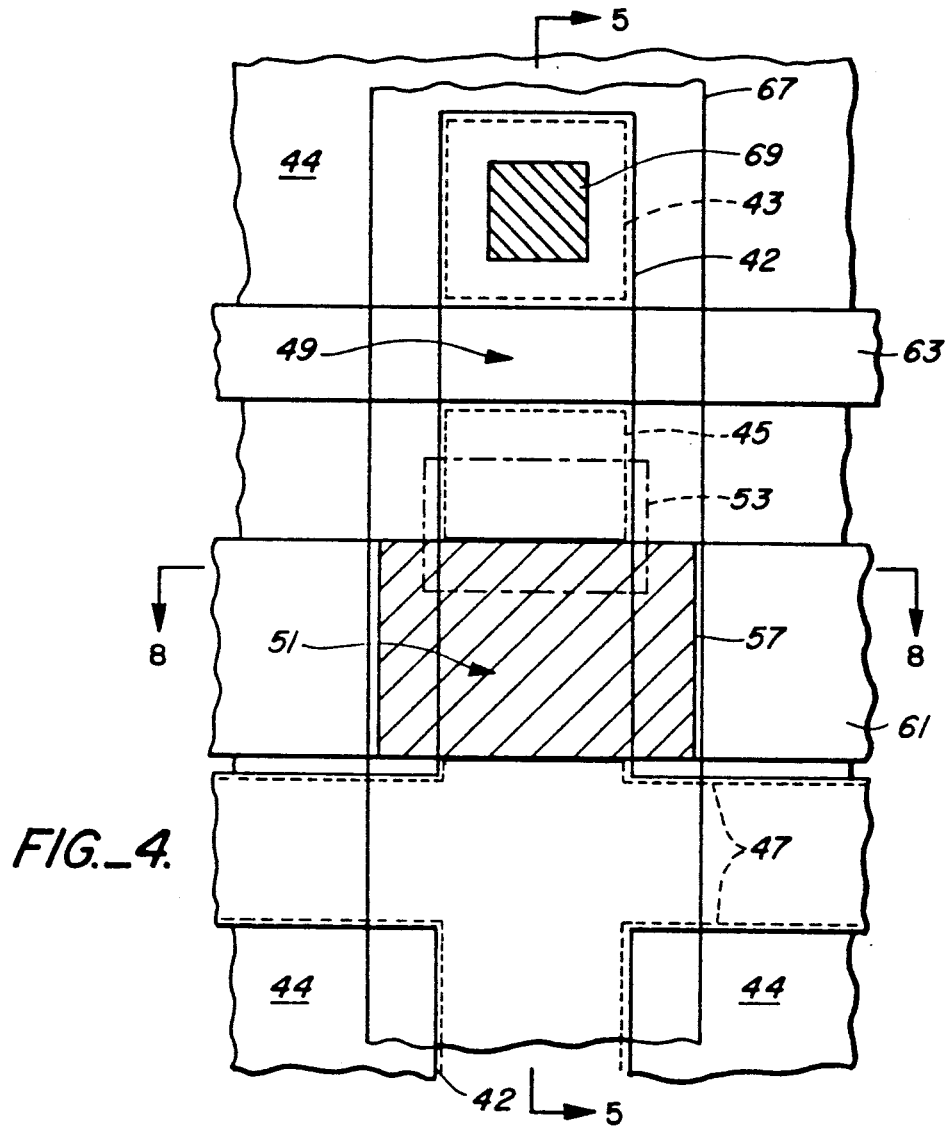
FIG._4.
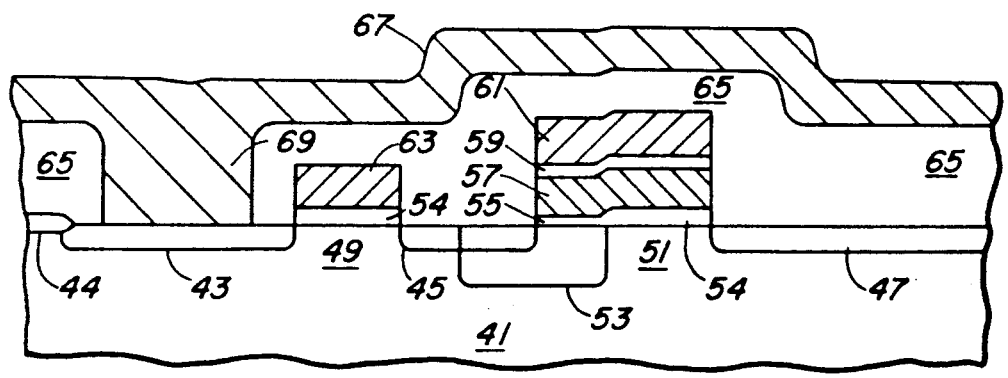
FIG._5.

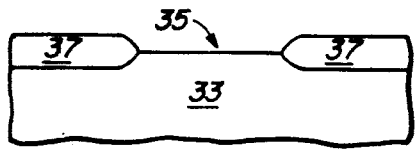
FIG._6A.
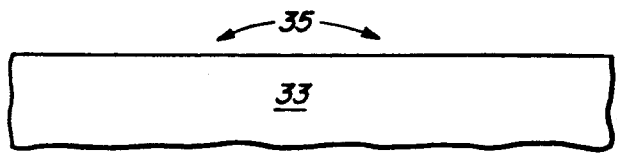
FIG._7A.
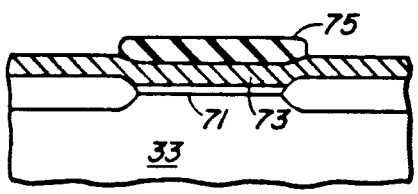
FIG._6B.
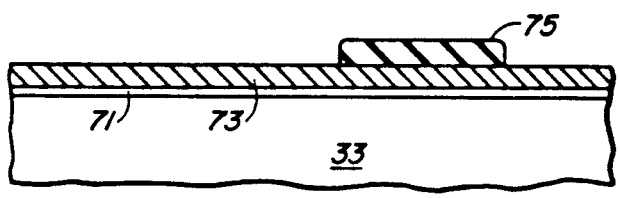
FIG._7B.
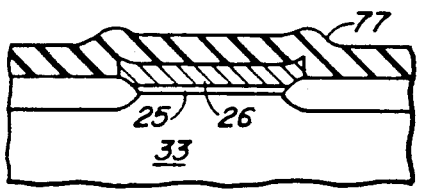
FIG._6C.
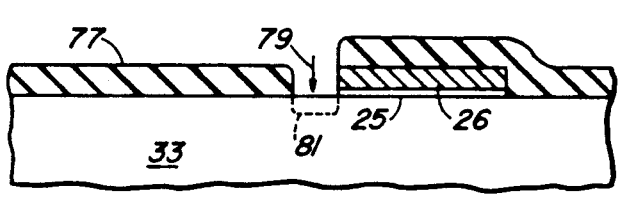
FIG._7C.
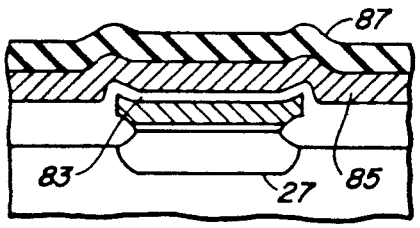
FIG._6D.
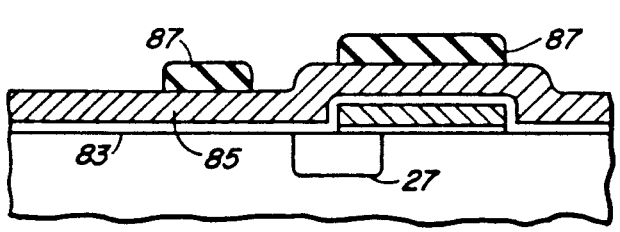
FIG._7D.
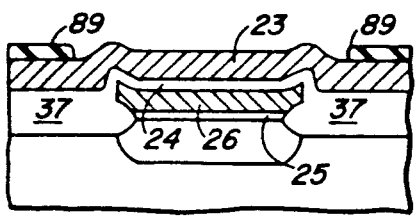
FIG._6E.
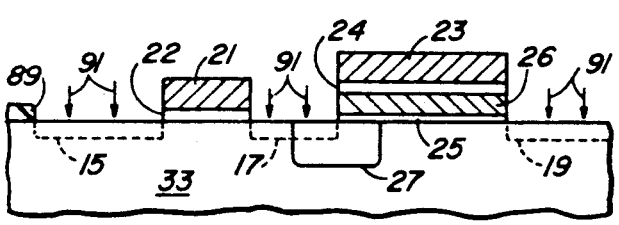
FIG._7E.

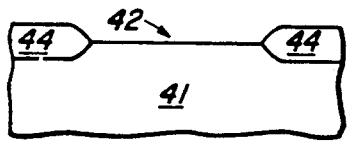
FIG._8A.
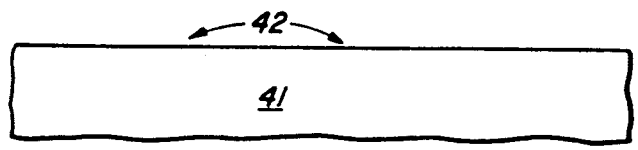
FIG._9A.
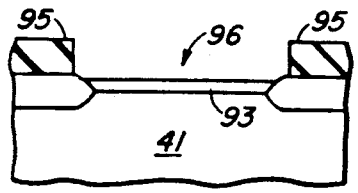
FIG._8B.
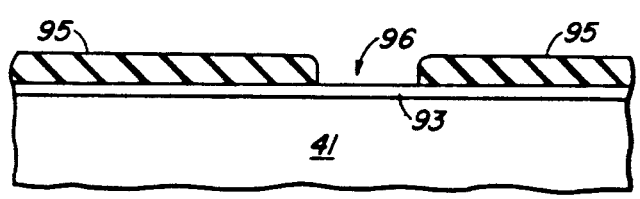
FIG._9B.
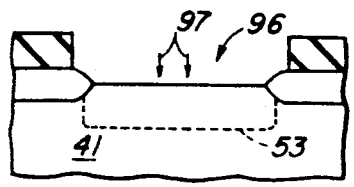
FIG._8C.
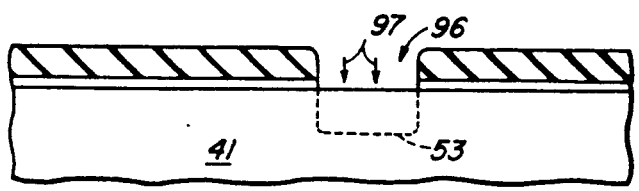
FIG._9C.
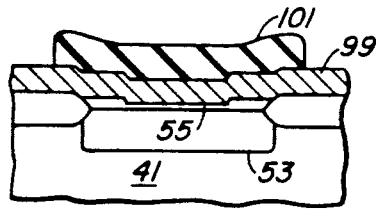
FIG._8D.
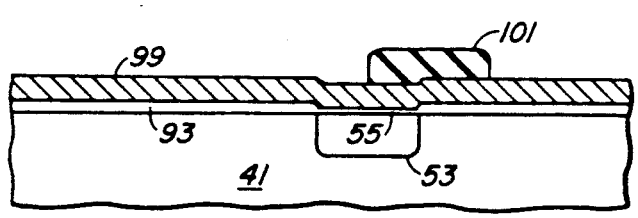
FIG._9D.
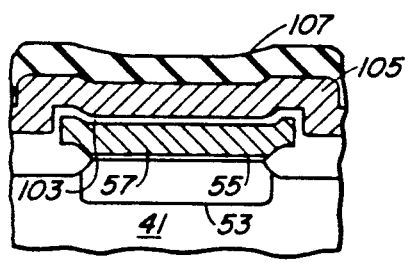
FIG._8E.
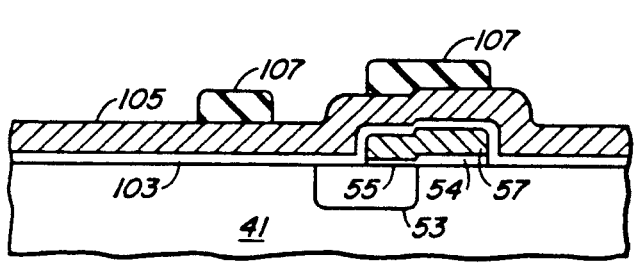
FIG._9E.
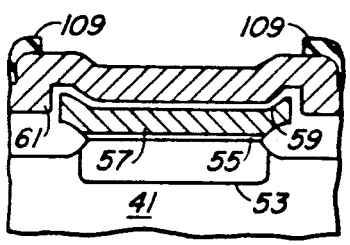
FIG._8F.
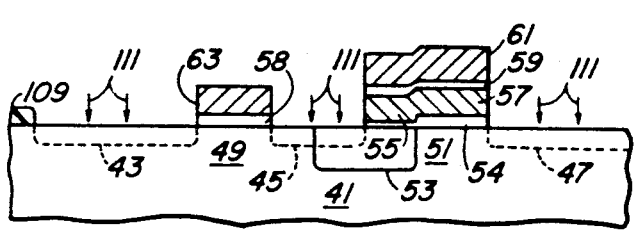
FIG._9F.

PROGRAMMABLE AND ERASABLE MOS MEMORY DEVICE

This is a continuation of Ser. No. 370.731, filed on June 23, 1989, now abandoned, which is a division of co-pending application Ser. No. 332,879, filed Apr. 3, 1989, now abandoned.

TECHNICAL FIELD

The present invention relates to MOS floating gate memory devices, and in particular to electrically programmable and rapidly erasable devices of the type known as "flash memory".

BACKGROUND ART

In U S. Pat. No. 4,203,158, Frohman-Bentchkowsky et al. disclose an electrically programmable erasable MOS memory device fabricated on a P-type silicon substrate and including N-type source and drain regions defining a channel therebetween An electrically floating polysilicon gate is formed above the channel The floating gate for most of the channel is separated from the substrate by an oxide layer of between 500 Å and 1000 Å thick. A much smaller area of the floating gate is separated from the substrate by a thin oxide layer of between 70 Å and 200 Å thick. This thin oxide layer extends over a third N-type region which is contiguous with the source region. The floating gate also extends over a portion of the third region and is separated from the third region by the thin oxide region A polysilicon program gate is disposed above the floating gate and insulated therefrom by another oxide layer The drain region of the memory device may also be a source for a selection transistor whose gate is coupled to a word select line.

In U.S. Pat. No. 4,598,460, Owens et al. disclose a method of making an integrated circuit EPROM having EPROM devices together with N-channel and P-channel peripheral devices, in which independently adjustable thresholds are provided for each of the three device types. The EPROM devices are formed with steps which may include etching through a polysilicon layer, an interpoly oxide layer and another polysilicon layer to form both a control gate and a floating gate beneath it, then implanting N-type arsenic ions adjacent to these gates, using the gates as a self-aligning mask, to form source and drain regions This may be followed by a phosphorus ion implant into the same source and drain regions using the same mask as was used for the arsenic implant. Since phosphorus has a greater diffusion rate than arsenic, subsequent heating results in the phosphorus outrunning the arsenic and spreading the sources and drains downward and laterally to create a high density core of arsenic ions for good ohmic contact surrounded by a low density shell of phosphorus ions that extend under the floating gate. Drain extension under the floating gate improves programming efficiency. The low density shell also reduces the chances of shorting due to any slight misregistration between metal contacts and the source and drain cores.

An object of the present invention is to provide a memory cell layout for electrically programmable and rapidly erasable MOS memory devices that result in a smaller memory cell size. Disclosure of the Invention The above object has been met with a programmable and erasable MOS memory device having a floating gate separated from a semiconductor substrate by a thin oxide layer and an N-type impurity implant in the substrate extending under an edge of the floating gate for rapid and efficient programming and erasing. In one embodiment, the thin oxide layer underlies the entire floating gate while in another the thin oxide layer is present only in a small window region which extends under an edge of the floating gate.

BRIEF DESCRIPTION OF THE DRAWINGS

FIG. 1 is a schematic circuit diagram of a memory cell of the present invention

FIG. 2 is a top plan view of the memory cell of FIG. 1.

FIG. 3 is a side sectional view taken along the line 3—3 in FIG. 2.

FIG. 4 is a top plan view of an alternative memory cell of the present invention.

FIG. 5 is a side sectional view taken along the line 5—5 in FIG. 4.

FIGS. 6a—6e are side sectional views taken along the line 6—6 in FIG. 2 after various steps in the fabrication process for the memory cell in FIG. 2.

FIGS. 7a-7e are side sectional views taken along the line 3—3 in FIG. 2 after various steps in the fabrication process for the memory cell in FIG. 2.

FIGS. 8a-8f are side sectional views taken along the line 8—8 in FIG. 4 after various steps in the fabrication process for the memory cell in FIG. 4.

FIGS. 9a-9f are side sectional views taken along the line 5—5 in FIG. 4 after various steps in the fabrication process for the memory cell in FIG. 4.

BEST MODE FOR CARRYING OUT THE INVENTION

With reference to FIG. 1, a memory cell of the present invention includes a memory device 11 and a field effect transistor 13 which allows selection of memory device 11 from among other memory cells. A drain 15 of selection transistor 13 is connected via a metal contact 31 to a read line 29. Selection transistor 13 and memory device 11 are connected together in series at a node 17 which serves as both a source for selection transistor 13 and a drain for memory device 11 A source 19 of memory device 11 connects to a common source line which in turn is coupled to ground. The gate 21 of selection transistor 13 is electrically connected to a word select line. The control gate 23 of memory device 11 is connected to a sense enable and program line. The circuit of the present invention also includes in the memory device 11 a floating gate 26 separated from the substrate by only a thin oxide layer, as represented in FIG. 1 by a dashed line 26. A program and erase implant 27 is provided in memory device 11 proximate to the device's drain at node 17. The thin oxide layer together with the program and erase implant 27 permit rapid erasure of the memory device 11 electrically in a few milliseconds, instead of the usual twenty minutes or so with UV light with the thicker oxide layer under the floating gate of prior memory devices. The implant 27 also enables more efficient reprogramming to occur. As will be seen below, the memory cell layout and fabrication process of the present invention provides for a smaller size memory cell.

With reference to FIGS. 2 and 3, a semiconductor chip having an array of memory cells comprises a semiconductor substrate 33 with active memory areas 35 therein. A field isolation oxide layer 37 is present over all nonactive areas outside of memory areas 35. Three spaced-apart implants 15, 17 and 19 are located in memory area 35 with channel areas 39 and 41 defined therebetween. Implant 15 forms a drain for the selection transistor 13 in the circuit of FIG. 1. Implant 17 forms a node functioning as both a source for selection transistor 13 and a drain for memory device 11 in FIG. 1. Implant 19 forms a source for memory device 11. While substrate 33 is typically P-type and implants 15, 17 and 19 are N-type.

A program and erase implant 27 is also present in the active memory area 35 of substrate 33. Implant 27 overlaps part of node implant 17, extending into channel 41 between implants 17 and 19 of the memory device 11. Implant 27 is N-type and may be formed by either phosphorus or arsenic ion implantation followed by diffusion, as explained below A thin oxide layer 25 is disposed over channel 41 between implants 17 and 19, including over the portion of program and erase implant 27 which extends into channel 41, in active area 35. Typically, thin oxide layer 25 is between 70 Å and 150 Å thick. The remainder of active area 35 between field oxide layer 37 has an oxide layer 22 over it. Oxide layer 22 is thicker than thin oxide layer 25, typically about 300-500 Å thick.

A polysilicon floating gate 26 is disposed on thin oxide layer 25 and extends over that portion of program and erase implant 27 that is beneath thin oxide layer 25. An interpoly oxide layer 24 is disposed on floating gate 26 and a polysilicon sense gate 23 is situated above interpoly oxide layer 24. A polysilicon select gate 21 is disposed above channel 39 between implants 15 and 17. The entire wafer is covered with an insulating glass layer 40 with vias for contacts 31 therein. A layer of conductive lines 29 is disposed on top of glass layer 40.

With reference to FIGS. 4 and 5, an alternate memory cell of the present invention comprises a semiconductor substrate 41 with an active memory area 42 defined therein and a layer of field isolation oxide 44 in all nonactive areas 44 outside of memory area 42. Three spaced-apart implant regions 43, 45 and 47 forming a selection transistor drain, a node and a memory device source, respectively are located in the substrate in memory area 42. Channels 49 and 51 are defined between implants 43, 45 and 47. Node implant 45 functions as both the source of the selection transistor and the drain of the memory device An oxide layer 54 is disposed over the substrate in memory areas 42 and a thin oxide window 55 is located therein. Thin oxide window 55 lies partly over node implant 45 and partly over the channel 51 between implants 45 and 47. Thin oxide layer 55 is typically 70 Å to 150 Å thick A program and erase implant 53 is present beneath thin oxide window 55, overlapping part of node implant 45 and extending into channel 51.

A polysilicon floating gate 57 is disposed over channel 51 in memory area 42. One edge of floating gate 57 lies over a portion of thin oxide window 55 and program and erase implant 53, while the remainder of floating gate 57 lies over the thicker gate oxide layer 54. An interpoly oxide layer 59 is disposed on top of floating gate 57 and a polysilicon sense gate 61 lies on top of interpoly oxide layer 59 Another polysilicon gate, select gate 63 of the selection transistor, is disposed over oxide layer 58 above channel 49 between implants 43 and 45.

An insulative glass layer 65 covers the substrate 41 and gates 57, 61 and 63. A layer of conductive lines 67 connects to selected gates and source and drain implants through via contact holes 69 in glass cover 65.

With reference to FIGS. 6a and 7a, the memory cell in FIGS. 2 and 3 is fabricated by a process which begins with a P-type monocrystalline silicon substrate 33. First, various device areas are defined, and in all other areas a field isolation oxide is grown. Such device area definition is well known in the art and typically includes all or some of the following steps. For CMOS devices, a N-well is formed. The N-well defines an area for P-channel peripheral transistors and is not necessary for NMOS devices A pad oxide is deposited over the wafer substrate followed by a nitride layer. Next a mask defines device areas including an active memory region 35, and the nitride layer is etched away from all nondevice areas. Boron is then implanted in the field around the N-well in the case of CMOS devices. Next, field oxide 37 is thermally grown in all nondevice areas, which are not covered by the oxygen impervious nitride layer The nitride layer and pad oxide layer are removed leaving the wafer in the condition shown in FIGS. 6a and 7a. This may be followed by an optional sacrificial oxide growth and removal step. As indicated, the steps described so far are well known in the art.

Referring to FIGS. 6b and 7b, a thin oxide layer 71 is grown on the substrate 33 in active memory area 35. Typically, oxide layer 71 is 70Å to 150 Å thick, with a preferred thickness being about 100 Å. A first polycrystalline silicon layer 73 is deposited over the wafer, including over thin oxide layer 71, and then doped with phosphorus to increase its conductivity. A mask 75 is applied to the surface of polysilicon layer 73 and floating gate areas are defined The polysilicon layer 73 and thin oxide layer 71 are then etched to remove them from all areas except beneath mask 75. This selective removal of layers 71 and 73 forms the floating gate 26 with its thin oxide underlayer 25 seen in FIGS. 6c and 7c. The mask 75 is then removed.

With reference to FIGS. 6c and 7c, a mask 77 is applied to the wafer surface and an opening is defined in the mask over the active memory area at an edge of the floating gate 26. An N-type impurity, indicated by arrow 79, is implanted into substrate 33 through the opening in the mask. Typically, the impurity is either phosphorus or arsenic implanted with an energy of from 50 to 100 keV to a dose of from $0. \times 10^{14}/cm^2$ to $5.0 \times 10^{14}/cm^2$. A preferred implantation dose is about $1.7 \times 10^{14}/cm^2$. The resulting implant 81 will later be driven in under floating gate 26 and thin oxide layer 25 by process steps involving heating to form the implant region 27 in FIG. 7d for efficient programming and erasing functions With reference to FIGS. 6d and 7d, after mask 77 has been stripped off, a second oxide layer 83 is thermally grown. Oxide layer 83 is typically about 300-500 Å thick and will form the second gate oxide and interpoly oxide beneath select gate 21 and sense gate 23 seen in FIGS. 6e and 7e. A second polysilicon layer 85 is deposited over oxide layer 83 then doped with phosphorus to increase its conductivity. A mask 87 is applied over polysilicon layer 85 to define the select and sense gates, and the polysilicon layer 85 and second oxide layer 83 are selectively etched. What remains of the polysilicon layer 85 forms select gate 21 and sense gate 23 in FIGS. 6e and 7e. Mask 87 is then removed.

With reference to FIGS. 6e and 7e, the process continues with steps known in the art to define sources and drains and metal contacts. A mask 89 covers areas of the wafer not to receive an implantation of N-type ions, for example, N-well areas in CMOS devices containing P-channel peripheral transistors. An N-type impurity, such as arsenic 91, is then implanted into source and drain implant regions 15, 17 and 19. If a CMOS device is intended, another mask protects the memory cell and N-channel peripheral transistors while a P-type impurity implant is made to define P-channel transistor sources and drains With reference to FIGS. 2 and 3, following source and drain definition, an insulative glass covering 40 is applied over the wafer to a thickness sufficient to cover gates 21, 23 and 26. Typically, covering 40 is about 1.0 micron thick. Via holes 31 are formed through covering 40 to selected sources, drains and gates. A layer 29 of conductive material, such as aluminum, is deposited over covering 40 and into via holes 31, then etched to define conductive lines If desired, a second layer of conductive lines may be formed over an intermetal insulative layer. Finally, the wafer backside is cleaned, a passivation coat is applied and pad openings are formed to complete the device.

With reference to FIGS. 8a and 9a, the fabrication of the device in FIGS. 4 and 5 begins by defining an active memory area 42 on a semiconductor substrate 41 and forming a layer 44 of field oxide in all nondevice areas of the wafer. The steps for carrying out this area definition and oxidation are the same as in the FIGS. 6a and 7a.

With reference to FIGS. 8b and 9b, a first gate oxide layer 93 is thermally grown on substrate 41 in active device areas 42. Typically, oxide layer 93 is about 300–500 Å thick. A mask 95 is applied over the wafer and a window 96 is defined in the mask. Oxide layer 93 is then selectively etched to remove oxide material from window area 96, as seen in FIGS. 8c and 9c. Leaving the mask 95 on the wafer, an N-type impurity, represented by arrows 97 in FIGS. 8c and 9c, is selectively implanted into substrate 41 in window area 96. The resulting implant 53 is activated in later steps involving heating and forms a program and erase enhancing implant. Typically, the N-type impurity is phosphorus implanted with an energy of 50 to 100 keV to a dose in a range from $0.5 \times 10^{14}$ /cm$^2$ to $5.0 \times 10^{14}$/cm$^2$. The preferred dose is about $1.7 \times 10^{14}$/cm$^2$. After implantation, the mask 95 is removed and a thin oxide layer 55, seen in FIGS. 8d and 9d, is thermally grown in window area 96. Thin oxide layer 55 is typically 70 Å to 150 Å thick.

With reference to FIGS. 8d and 9d, a first polysilicon layer 99 is deposited on the wafer over oxide layer 93 and thin oxide window 55 and doped with phosphorus to increase its conductivity. A mask 101 is used to define a floating gate area extending over a portion of window oxide 55. Polysilicon layer 99 and oxide layer 93 are then etched to form floating gate 57, seen in FIGS. 8e and 9e. After etching mask 101 is removed.

With reference to FIGS. 8e and 9e, a second gate oxide layer 103 is thermally grown to a thickness of about 300–500 Å over substrate 41 and floating gate 57. A second polysilicon layer 105 is deposited over second oxide layer 103 and doped with phosphorus to increase its conductivity. A mask 107 is applied to the top of polysilicon layer 105 and gate areas are defined therewith. Second polysilicon layer 105 and second gate oxide layer 103 are then selectively etched to define control gates 61 and 63, seen in FIGS. 8f and 9f. The control gates include a sense gate 61 located over floating gate 57 with an interpoly oxide layer 59 between the two gates. The control gates also include a select gate 63 for a selection transistor.

With reference to FIGS. 8f and 9f, after gate formation the process continues with steps identical to that in FIGS. 6e and 7e to define sources and drains and metal contacts A mask 109 covers areas of the wafer not to receive an implantation of N-type ions 111. The N-type impurity 111, typically arsenic, is implanted into regions 43, 45 and 47, while P-type impurity ions, not shown, are implanted into P-channel source and drain regions in CMOS devices. Returning to FIGS. 4 and 5, a glass insulative covering 65 with via holes 69 to selected sources, drains and gates is formed, then a layer of conductive lines 67 is formed over the covering 65, using steps well known in the art.

We claim:

1. An electrically programmable and electrically erasable MOS memory device comprising,
   a semiconductor substrate of a first conductivity type with at least one active memory area defined therein,
   a field isolation oxide layer disposed on the substrate in all nonactive areas,
   a plurality of implants of a second conductivity type extending to a first depth, having a first doping concentration and having edges spaced lengthwise apart in said active memory area, said implants defining first and second channels therebetween,
   a program-and-erase implant of said second conductivity type extending to a second depth, greater than the first depth, and located in said active memory area, said program-and-erase implant overlapping one of said plurality of spaced apart implants in said active memory area and extending into said second channel,
   a relatively thin oxide tunnel layer disposed over the entire second channel including over that portion of said program-and-erase implant which extends into said second channel,
   a relatively thick oxide layer disposed over the entire first channel,
   a polysilicon floating gate disposed over said thin oxide tunnel portion above said second channel, said floating gate having opposed edges, one of the edges aligned with one edge of two of said plurality of implants of the second conductivity type, said floating gate also covering said portion of said program-and-erase implant which extends into said second channel with said thin oxide tunnel portion therebetween, said thin oxide tunnel portion underlying the entire length of said floating gate,
   a polysilicon select gate disposed over said relatively thick oxide layer above said first channel, thereby forming a select transistor,
   a interpoly insulation layer of substantially uniform thickness disposed over said floating gate, and
   a control gate disposed over said interpoly insulative layer and capacitively coupling to said floating gate for enabling tunneling of charge carriers between said program-and-erase implant and said floating gate through said thin oxide tunnel portion.

2. The memory device of claim 1 wherein said thin oxide tunnel layer has a thickness in a range from 70 Å to 150 Å, and said relatively thick oxide layer is thicker than said thin oxide tunnel layer.

3. The memory device of claim 1 wherein said program-and-erase implant contains an N-type impurity selected from the group consisting of phosphorus and arsenic.

4. The memory of claim 1 further comprising,
a covering of insulative material over said active memory area, said covering having a via hole therein to a selected implant, and
a layer containing a conduction line over said covering, said conduction line connected to said selected implant through said via hole.

* * * * *